(12) United States Patent
Roig-Guitart

(10) Patent No.: US 12,556,175 B2
(45) Date of Patent: Feb. 17, 2026

(54) DRIVING SIGNAL-BASED REDUCTION OF GATE SWITCHING INSTABILITY FOR SEMICONDUCTOR POWER SWITCH

(71) Applicant: SEMICONDUCTOR COMPONENTS INDUSTRIES, LLC, Scottsdale, AZ (US)

(72) Inventor: Jaume Roig-Guitart, Oudenaarde (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 22 days.

(21) Appl. No.: 18/647,102

(22) Filed: Apr. 26, 2024

(65) Prior Publication Data

US 2025/0266818 A1 Aug. 21, 2025

Related U.S. Application Data

(60) Provisional application No. 63/555,563, filed on Feb. 20, 2024.

(51) Int. Cl.
| | | |
|---|---|---|
| H03K 17/06 | (2006.01) | |
| H03K 17/0412 | (2006.01) | |
| H03K 17/16 | (2006.01) | |

(52) U.S. Cl.
CPC ..... *H03K 17/063* (2013.01); *H03K 17/04123* (2013.01); *H03K 17/162* (2013.01)

(58) Field of Classification Search
CPC ........... H03K 17/063; H03K 17/04123; H03K 17/162; H03K 17/06; H03K 17/0412; H03K 17/041; H03K 17/0416; H03K 17/04163

See application file for complete search history.

(56) References Cited

U.S. PATENT DOCUMENTS

| | | | |
|---|---|---|---|
| 2018/0062633 A1 | 3/2018 | Nomura | |
| 2021/0396596 A1* | 12/2021 | Akin | G01K 7/00 |

FOREIGN PATENT DOCUMENTS

| | | |
|---|---|---|
| WO | 2012165649 A1 | 12/2012 |
| WO | 2022119835 A1 | 6/2022 |

OTHER PUBLICATIONS

Zhao, Shuang et al., A Review of Switching Slew Rate Control for Silicon Carbide Devices Using Active Gate Drivers, IEEE Journal of Emerging and Selected Topics in Power Electronics, vol. 9, No. 4, Aug. 2021.

(Continued)

*Primary Examiner* — Jung Kim
(74) *Attorney, Agent, or Firm* — Quinn IP Law

(57) ABSTRACT

An electrical circuit is usable as part of an electric drive system having a direct current (DC) power supply, a DC link capacitor, and an inverter circuit for powering an electric machine. The electrical circuit includes a driver circuit connected to a gate terminal of a power switch, e.g., a silicon carbide power metal-oxide semiconductor field effect transistor (SiC power MOSFET). The power switch has a gate-to-source voltage responsive to a driving voltage, and a degradation interval during which the gate-to-source voltage increases from a relatively low voltage level below a threshold voltage toward a relatively high voltage level above the threshold voltage. The driver circuit is operable to shape a trajectory of the driving voltage over the degradation interval such that the driving voltage is non-linear across over a full duration of the degradation interval.

20 Claims, 11 Drawing Sheets

(56) References Cited

OTHER PUBLICATIONS

"Guideline for Evaluating Gate Switching Instability of Silicon Carbide Metal—Oxide-Semiconductor Devices for Power Electronic Conversion," published by: JEDEC Solid State Technology Association, Arlington, VA, Feb. 2023.
LELIS at el., "AC-Stress Degradation in SiC MOSFETs," U.S. Army DEVCOM Army Research Laboratory, Materials Science Forum, published by Trans Tech Publications Ltd, Switzerland, ISSN: 1662-9752, vol. 1092, p. 151-155.

* cited by examiner

DRIVING SIGNAL-BASED REDUCTION OF GATE SWITCHING INSTABILITY FOR SEMICONDUCTOR POWER SWITCH

CROSS-REFERENCE TO RELATED APPLICATIONS

The present application claims the benefit of priority to U.S. Provisional Application No. 63/555,563 filed on Feb. 20, 2024, which is hereby incorporated by reference in its entirety.

TECHNICAL FIELD

The present disclosure relates generally to the switching control of a voltage-controlled semiconductor power switch, and in particular to a gate drive circuit and associated methodology for controlling a conductive state of the power switch.

BACKGROUND

High-voltage electric drive systems typically include a direct current (DC) voltage bus connected to a DC power supply, for instance a lithium-ion or nickel-metal hydride battery pack. One or more single-phase or polyphase electric motors may be driven by inverter circuitry connected to the DC voltage bus. Resident semiconductor power switches of the inverter circuitry, as well as of other circuits of the electric drive system such as voltage rectifiers and DC-DC converters, employ voltage-controlled semiconductor switches to generate a desired voltage or current waveform.

Voltage-controlled power switches are available in various constructions for use in a wide range of power electronic applications. For instance, switching circuits of an electric drive system typically use metal-oxide semiconductor field effect transistors (MOSFETs) as high-frequency switching devices having drain, source, and gate terminals, with the gate terminal acting as a control terminal when operating the power switch. That is, a gate-to-source voltage is determined via provision of a driving voltage to the gate terminal by a driver circuit. This action alters a drain-to-source resistance level of the power switch and changes its ON/OFF conductive state.

SUMMARY

The solutions described herein are intended to reduce gate switching instability (GSI) of a semiconductor power switch in an electrical circuit. According to JEDEC® Publication No. JEP195, "Guideline for Evaluating Gate Switching Instability of Silicon Carbide Metal-Oxide-Semiconductor Devices for Power Electronic Conversion", published on Feb. 1, 2023 by the JEDEC® Solid State Technology Association, GSI refers to the undesirable phenomenon of a "threshold instability of a MOS device operating in a gate switching mode between a voltage much above the threshold voltage and below the flatband voltage", and thus "describes the degradation in the conduction path of the device driven by the switching event." This phenomenon is referred to in the art by different terms, including "alternating current (AC) gate-bias stress" and "gate-switching stress", with the term "GSI" used herein for illustrative consistency. Reduction of GSI is accomplished in various manners using the solutions as described below.

In particular, an electrical circuit is described herein that includes a semiconductor power switch and an associated driver circuit. The power switch, which may be optionally constructed as a metal-oxide semiconductor field-effect transistor (MOSFET), for instance a silicon carbide (SiC) power MOSFET, has a threshold voltage ($V_{TH}$), a gate-to-source voltage ($V_{GS}$) responsive to a driving voltage ($V_{DR}$), and a degradation interval ($t_{deg}$). During the degradation interval, the gate-to-source voltage increases from a relatively low voltage level ($V_{GS\_L}$) that has a lower magnitude than/is below the threshold voltage. In response to the driving voltage, the gate-to-source voltage increases toward a relatively high voltage level ($V_{GS\_H}$) having a magnitude that exceeds the threshold voltage. The driver circuit, which is connected to a gate terminal of the power switch, is used to shape or generate a non-linear trajectory of the driving voltage over a full duration of the degradation interval.

The driver circuit may be optionally constructed as a multi-level driver circuit, e.g., one having three or more driver circuits.

The non-linear trajectory of the driving voltage over the full duration of the degradation interval may include multiple ramped or stepped segments, or the trajectory may be constructed as a periodic oscillating trajectory. The latter implementation may be accomplished using a resonant tank in one or more embodiments.

The electrical circuit may also include a reducing circuit configured to reduce a rate of change $$\left(\frac{dv_{GS}}{dt}\right)$$

of the above-noted gate-to-source voltage during the degradation interval. A possible implementation of the reducing circuit includes a bleeding resistor ($R_B$) coupled to a gate terminal of an N-type MOSFET, a diode connected to a drain terminal of the N-type MOSFET, and a capacitance divider connected to the bleeding resistor and the N-type MOSFET.

Also disclosed herein is an electric drive system. The electric drive system may include a direct current (DC) power supply connected in parallel with a DC link capacitor, an inverter circuit connected to the DC link capacitor, a polyphase electric machine connected to the inverter circuit, a rotary output member coupled to the polyphase electric machine, and a load coupled to the rotary output member.

In a possible embodiment, the inverter circuit includes a plurality of silicon carbide (SiC) power MOSFETs. Each respective one of the SiC power MOSFETs has a threshold voltage, a gate-to-source voltage responsive to a driving voltage, and a degradation interval during which the gate-to-source voltage increases from the relatively low voltage level toward the relatively high voltage level as summarized above. In this particular implementation, a plurality of driver circuits are connected to a respective gate terminal of a different one of the SiC power MOSFETs. The driver circuits are collectively operable to shape or generate a non-linear trajectory of the driving voltage over the full duration of the degradation interval.

The above summary is not intended to represent every embodiment or aspect of the present disclosure. Rather, the foregoing summary exemplifies certain novel aspects and features as set forth herein. The above noted and other features and advantages of the present disclosure will be readily apparent from the following detailed description of representative embodiments and modes for carrying out the present disclosure when taken in connection with the accompanying drawings and the appended claims.

BRIEF DESCRIPTION OF THE DRAWINGS

The drawings described herein are for illustrative purposes only, are schematic in nature, and are intended to be exemplary rather than to limit the scope of the disclosure.

Figure 1:
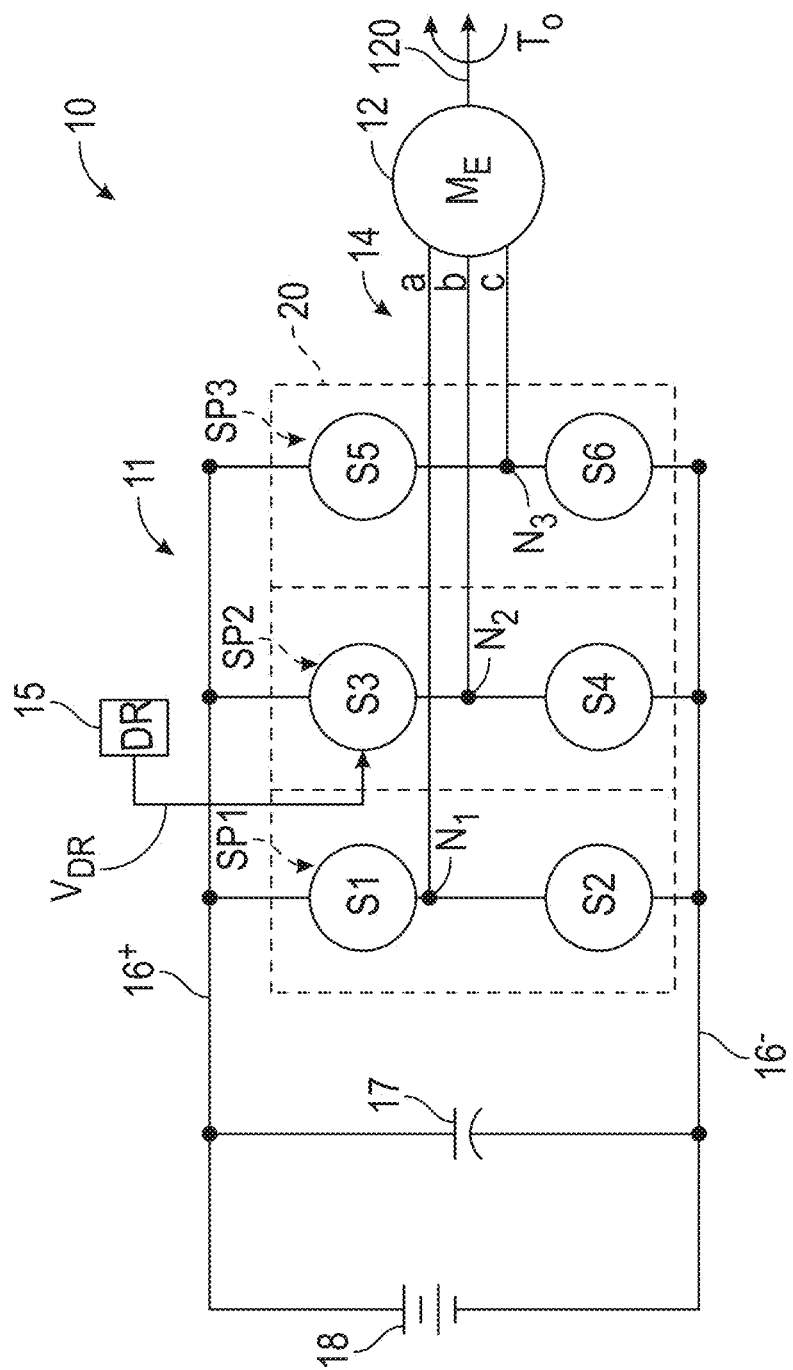
FIG. 1 illustrates an exemplary inverter circuit for energizing a polyphase electric machine, with the inverter circuit using voltage-controlled power switches controlled in accordance with the present disclosure to reduce gate switching instability (GSI).

The present disclosure may be modified or embodied in alternative forms, with representative embodiments shown in the drawings and described in detail below. Inventive aspects of the present disclosure are not limited to the disclosed embodiments. Rather, the present disclosure is intended to cover alternatives falling within the scope of the disclosure as defined by the appended claims.

DETAILED DESCRIPTION

With reference to the drawings, wherein like reference numbers refer to the same or similar components throughout the several views, an electric drive system 10 is illustrated in FIG. 1 having an exemplary polyphase rotary electric machine ($M_E$) 12. The electric drive system 10 may include semiconductor power switches 20 each driven by gate-to-source voltage ($V_{GS}$) from a corresponding driver circuit 15 as set forth herein, with the driver circuits (DR) 15 and power switches 20 together forming an electrical circuit 21 (e.g., FIG. 3B). For simplicity, the power switch 20 labeled S3 is shown driven by a driver circuit 15. In an actual implementation, each of the power switches 20 will be driven by a corresponding driver circuit 15, as appreciated in the art. Also, although the power switches 20 are shown as part of an exemplary alternating current (AC)-to-direct current (DC) inverter circuit 11 in FIG. 1, those skilled in the art will appreciate that other power electronic devices may benefit from use of the power switches 20, including for instance voltage rectifiers, DC-DC converters, and the like, and therefore the present teachings are not limited to the representative use illustrated in FIG. 1.

The power switches 20 may be embodied as any voltage-controlled switch that is susceptible, absent the present teachings, to undesirable effects of gate switching instability (GSI). The power switches 20 as contemplated herein may be embodied as wide bandgap (WBG) switches, for instance silicon carbide (SiC) power MOSFETs. Other voltage-controlled power switches that may benefit from the present teachings include, by way of example and not of limitation, gallium nitride (GaN) switches, insulated gate bipolar transistors (IGBTs), and silicon-controlled rectifiers (SCRs). For illustrative consistency, the power switches 20 will be described hereinbelow in a representative embodiment as SiC power MOSFETs without limiting the power switches 20 to any particular construction unless otherwise specified.

The rotary electric machine 12 may be embodied as an electric traction motor for powering a load in a stationary or mobile system in one or more embodiments, includes the phase leads 14, with each of the phase leads 14 being connectable to the inverter circuit 11. For example, a typical three-phase embodiment of the electric machine 12 includes three phase leads 14, which in turn are individually labeled "a", "b", and "c" to indicate nominal a, b, and c phases. The electric drive system 10 also includes a positive voltage rail $16^+$, a negative voltage rail $16^-$ (electrical ground), and a DC link capacitor 17. The DC link capacitor 17 is connected to the respective positive and negative voltage rails ($16^+$, $16^-$) and configured to receive a DC voltage waveform from a DC voltage supply 18, for instance a multi-cell electrochemical battery pack of an application-suitable battery chemistry such as lithium-ion, lithium-metal, nickel-metal hydride, etc.

Within the inverter circuit 11 of FIG. 1, a plurality of the power switches 20, also individually labeled S1, S2, S3, S4, S5, and S6, are arranged in multiple switching pairs SP1, SP2, and SP3, i.e., power switches (S1, S2), (S3, S4), and (S5, S6), respectively. Each respective switching pair SP1, SP2, and SP3 is connected to the DC link capacitor 17 and a corresponding one of the phase leads 14 of the electric machine 12. That is, the switching pairs SP1, SP2, and SP3 are respectively connected to the nominal a, b, and c phase leads 14 at nodes $N_1$, $N_2$, and $N_3$. Each power switch 20 is voltage-controlled by a corresponding gate drive circuit, one of which is schematically illustrated in FIG. 1 for simplicity.

During normal switching operations, the phase leads 14 are energized by switching control operation of the inverter circuit 11 to generate motor output torque (To) on a rotary output member 120. Being voltage-controlled devices, however, the power switches 20 may experience GSI during operation. Such a condition may be more prevalent in certain constructions of the power switches 20, with trench gate SiC MOSFETs in particular being susceptible to the effects of GSI. However, GSI appears to at least some extent in all voltage-controlled power switches, and therefore the present teachings are not limited to SiC MOSFETs in general or trench gate SiC MOSFETs in particular.

Figure 2:
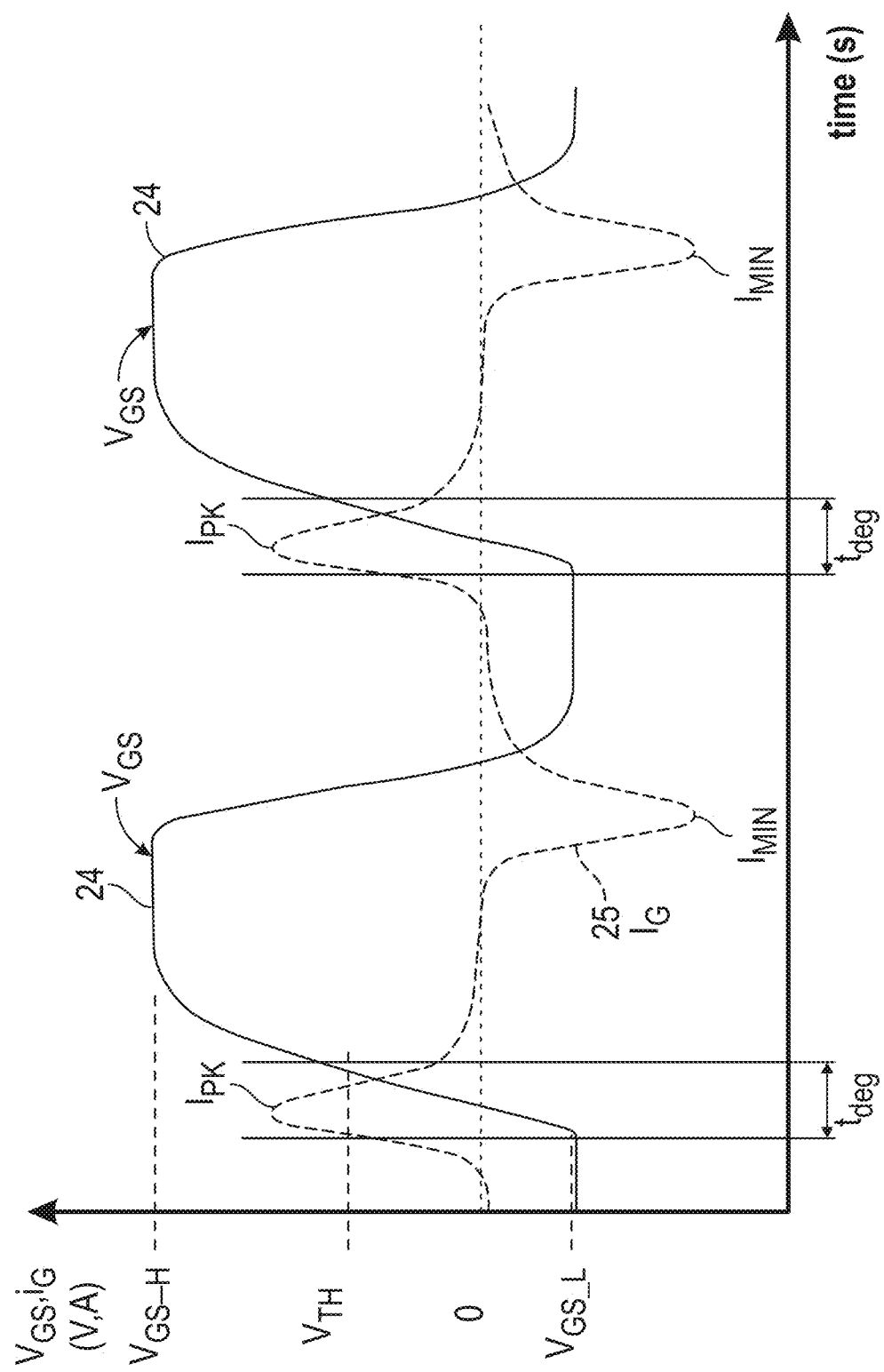
FIG. 2 is a time plot of a gate-to-source voltage ($V_{GS}$) and a gate current ($I_G$) describing degradation intervals as used herein.

Referring briefly to FIG. 2, in which time in seconds (s) is illustrated on the horizontal axis and voltage and current magnitude in volts (V) and amps (A) are illustrated on the vertical axis, gate switching instability (GSI) is a significant degradation mechanism for long term operation of voltage-controlled power switches. GSI as contemplated herein is a dynamic effect occurring during regular gate driving, when the gate-to-source voltage ($V_{GS}$) has fast ramp times of less than about 200 nanoseconds (ns), a $$\frac{d_{V_{GS}}}{dt}$$

of about 0.1 volts/ns (V/ns) to 0.3 V/ns, and a peak gate current ($I_{PK}$) of about 1 ampere or more. Among other potential issues, GSI can cause permanent shifts in threshold voltage ($V_{TH}$) and drain-source ON state resistance ($R_{dson}$) (not depicted in FIG. 2) with operational time, with the shift being recoverable only at annealing temperatures exceeding about 400° Celsius (C). Practically speaking, however, a junction temperature of 400° C. will never be reached during real applications, and thus degradation is non-recoverable.

Degradation occurs in the turn-on, and is defined by the interval ($t_{deg}$) where the gate-to-source voltage $V_{GS}$ (trace 24) ramps from a relatively low voltage level ($V_{GS\_L}$) to the threshold voltage $V_{TH}$, i.e., the particular value of $V_{GS}$ that is needed to turn on the power switch 20 for linear and saturation regions of operation as appreciated in the art, and continues toward a relatively high voltage level ($V_{GS\_H}$). Threshold voltages ($V_{TH}$) of about 3V to about 6V are typical. The relatively high voltage level, $V_{GS\_H}$, lies between the relatively low voltage level ($V_{GS\_L}$) and the threshold voltage ($V_{TH}$). During the degradation interval ($t_{deg}$), a more negative value of $V_{GS\_L}$ and a larger value of $$\frac{d_{V_{GS}}}{dt}$$

enhances the above-noted degradation. Gate current $I_G$ (trace 25) is likewise shown in FIG. 2, with peak gate current ($I_{PK}$) and minimum gate current ($I_{MIN}$) also illustrated. Solutions to reducing $$\frac{d_{V_{GS}}}{dt},$$

such as increasing gate resistance, tend to penalize transient power loss and are therefore suboptimal. In contrast, the present solutions incorporate a new driving method to reduce $$\frac{d_{V_{GS}}}{dt}$$

without impacting switching losses, thereby reducing GSI in the controlled power switches 20 illustrated in FIG. 1.

Figure 3A:
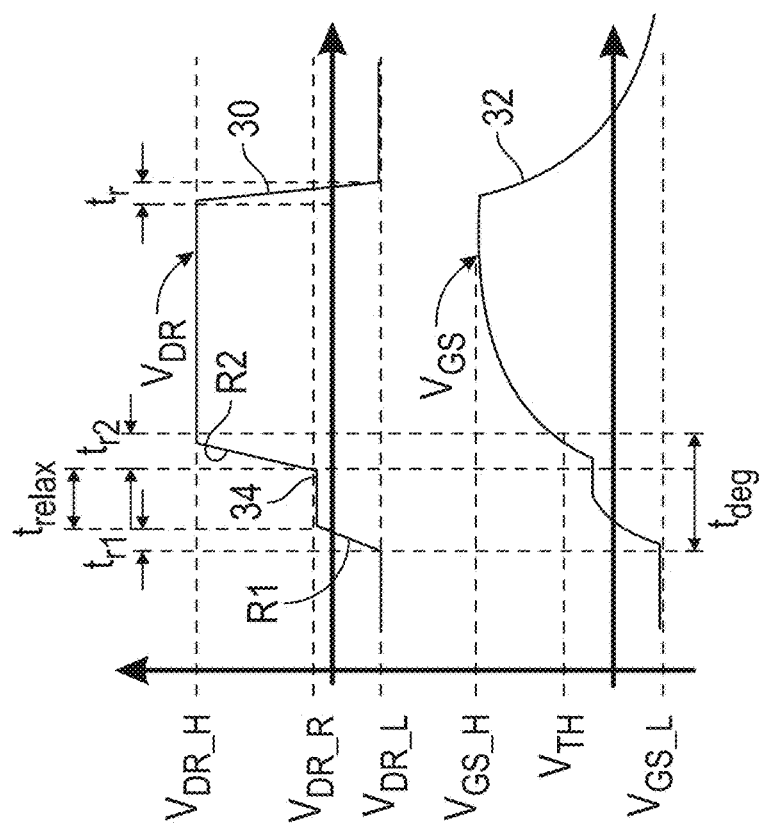
FIGS. 3A, 3B, and 3C illustrate an exemplary driving signal, driver circuit, and voltage pulses for reducing GSI in accordance with an aspect of the disclosure.
Figure 3:
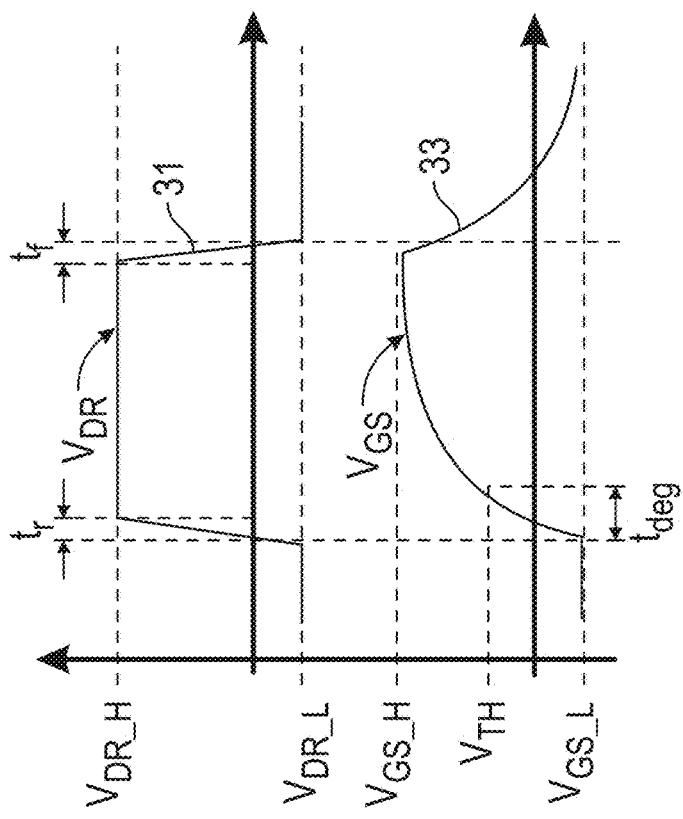
FIG. 3 illustrates a baseline driving voltage ($V_R$) and gate-to-source voltage as it might appear absent the present teachings.

Referring briefly to FIG. 3, which illustrates a driving voltage ($V_{DR}$) signal as trace 31 and a gate-to-source voltage ($V_{GS}$) signal (trace 33) at gate and source terminals of a controlled power switch when not connected to a load, the driving voltage ($V_{DR}$) is shown rising linearly from a relatively low voltage level ($V_{DR\_L}$), e.g., about −3V to about −8V, toward a relatively high voltage level ($V_{DR\_H}$), typically about 15V to about 20V. This rise occurs over a rising ramp interval ($t_r$). The driving voltage ($V_{DR}$) is sustained at the relatively high voltage level ($V_{DR\_H}$) for a calibrated duration before returning to the relatively low voltage level ($V_{DR\_L}$), with the trajectory occurring over a falling ramp interval ($t_f$).

The corresponding gate-to-source voltage ($V_{GS}$) is illustrated as rising parabolically from the relatively low voltage level ($V_{GS}$) through the defined threshold voltage ($V_{TH}$) over the above-noted degradation interval ($t_{deg}$), with $V_{GS\_L}$ being about −3V to about −8V (as with $V_{DR\_L}$ as noted above), continuing in this manner until reaching the relatively high voltage level ($V_{GS\_H}$), e.g., about 15V to about 20V. The gate-to-source voltage ($V_{GS}$) thereafter drops rapidly back to the relatively low voltage level ($V_{GS\_L}$) when the power switch 20 is commanded OFF, i.e., with the start of the falling ramp interval ($t_f$) of the driving voltage signal ($V_{DR}$).

In contrast, trace 30 of FIG. 3A represents an alternative driving voltage ($V_{DR}$) signal from the driver circuit 15 of FIG. 1 to a gate contact of a corresponding power switch 20. The driving voltage ($V_{DR}$) rises from the level of the relatively low voltage ($V_{DR\_L}$) to that of the relatively high voltage ($V_{DR\_H}$) over the above noted degradation interval ($t_{deg}$), i.e., the turn-on interval of the power switch 20. In accordance with the disclosure, the ramp from $V_{DR\_L}$ to $V_{DR\_H}$ is non-linear over the full duration of the degradation interval ($t_{deg}$), and thus is not constant. That is, while portions or segments of the generated trajectory may increase linearly during the degradation interval ($t_{deg}$), the trajectory as a whole—taken over the full duration of the degradation interval ($t_{deg}$)—is non-linear. Instead, the degradation interval ($t_{deg}$) is separated into several intervals $t_{r1}$, $t_{relax}$, and $t_{r2}$ as shown, with r in this instance indicating a rising trajectory. The relatively high voltage level ($V_{DR\_H}$) is then maintained for a predetermined duration until the driving voltage ($V_{DR}$) indicated by trace 30 ramps back down to the level of the relatively low voltage ($V_{DR\_L}$), which occurs over the falling duration $t_f$, with f here representing a falling trajectory.

Trace 32 of FIG. 3A represents the gate-to-source voltage ($V_{GS}$), likewise with representative low and high voltages $V_{GS\_L}$ and $V_{GS\_H}$, respectively. The threshold voltage ($V_{TH}$) is also illustrated as the minimum voltage required to turn on the power switch 20 and thereby cause a current to flow between source and drain terminals. The non-linear trajectory of trace 30 over the full duration of the degradation interval ($t_{deg}$) may include a plateau segment 34, with a pair of ramped segments (R1, R2) are connected by the plateau segment 34. Relative to trace 33 of FIG. 3, therefore, the resulting trajectory of trace 32 provides a reduced level of GSI.

Implementation of traces 30 and 32 of FIG. 3A may proceed by adding a relax time interval ($t_{relax}$) to a scheme in which $V_{TH}>V_{DR\_R}>V_{DR\_L}$. The time to ramp the driving voltage $V_{DR}$ from $V_{DR\_L}$ to $V_{DR\_R}$ (i.e., $t_{r1}$) added to the $V_{DR-R}$ plateau time ($t_{relax}$), is longer than the time normally taken to ramp directly from $V_{DR\_L}$ to $V_{DR\_H}$, i.e., $t_{r1}+t_{relax}>t_r$, with the actual extent of the increase being application dependent and customizable. The time to ramp the driving voltage ($V_{DR}$) from $V_{DR\_R}$ to $V_{DR\_H}$, i.e., $t_{r2}$, is typically not longer than $t_r$, i.e., $t_{r2} \leq t_r$. Moreover, the time to ramp $V_{GS}$ from $V_{GS\_L}$ to $V_{TH}$, i.e., $t_{deg}$, is longer relative to that of FIG. 3, thus reducing GSI. The time to ramp the driving voltage ($V_{DR}$) from $V_{TH}$ to $V_{GS\_H}$ is also equal to or less than the baseline level of FIG. 3, which ensures that switching losses are not increased when the power switches 20 of FIG. 1 operate on a load. In general terms, $t_r \sim t_f \sim t_{r2} \sim 1\text{-}20$ ns, while $t_{r1} \sim t_{relax} \sim 10\text{-}200$ ns.

Figures 3B, 3C:
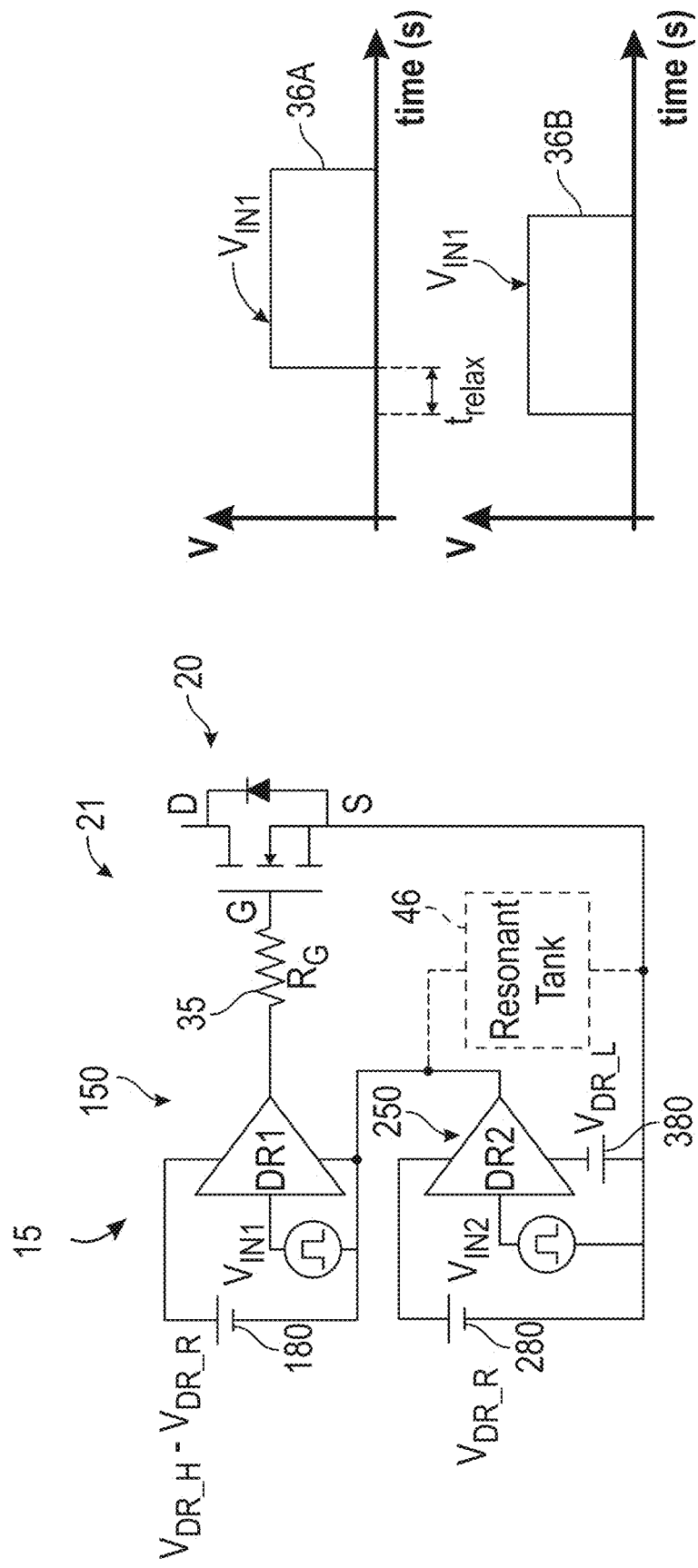

A representative embodiment of the driver circuit 15 suitable for providing the trajectories of FIG. 3A is shown in FIG. 3B. In lieu of a single driver, in this embodiment the driver circuit 15 is constructed as respective first and second driver circuits 150 and 250 (DR1 and D2). For the power switch 20 having a gate terminal (G), a source terminal (S), and a drain terminal (D), the respective first and second driver circuits 150 and 250 are connected to the respective gate terminal (G) and source terminal (S), with the connection to the gate terminal (G) being through a gate resistor ($R_G$) 35 of the electrical circuit 21 (see FIG. 3B), possibly as part of the driver circuit 15.

The first and second driver circuits 150 and 250 each have a corresponding local voltage source 180 or 280. For example, $V_{DR\_R}$ of FIG. 3A may be provided by the local voltage source 280, with the low voltage ($V_{DR\_L}$) provided by another local voltage source 380. Voltage source 180 has a corresponding voltage level of $V_{DR\_H}$-$V_{DR\_R}$. Input pulses ($V_{IN1}$ and $V_{IN2}$) are provided to the respective driver circuits 150 and 250 to generate the pulses 36A and 36B of FIG. 3C. Note that pulse 36A, i.e., $V_{IN1}$, lags pulse $V_{IN2}$ by the duration of $t_{relax}$ shown in FIG. 3A and described above. An optional resonant tank 46 may be added to the driver circuit 15 to produce an oscillatory signal as described below with reference to FIG. 6.

The approach of FIGS. 3A-C may be modified in other embodiments within the scope of the disclosure. For instance, as shown by trajectories of traces 300 and 320 ($V_{DR}$ and $V_{GS}$, respectively) in FIG. 4A one may implement the approach of FIG. 3A with the interval $t_{relax}$ tending to zero, such that there is a resulting lack of a plateau in the trajectories of $V_{DR}$ and $V_{GS}$. In other words, the interval $t_{r1}$ forms most of the degradation interval $t_{deg}$, with the remainder of $t_{deg}$ being the duration $t_{r2}$.

Figure 4A:
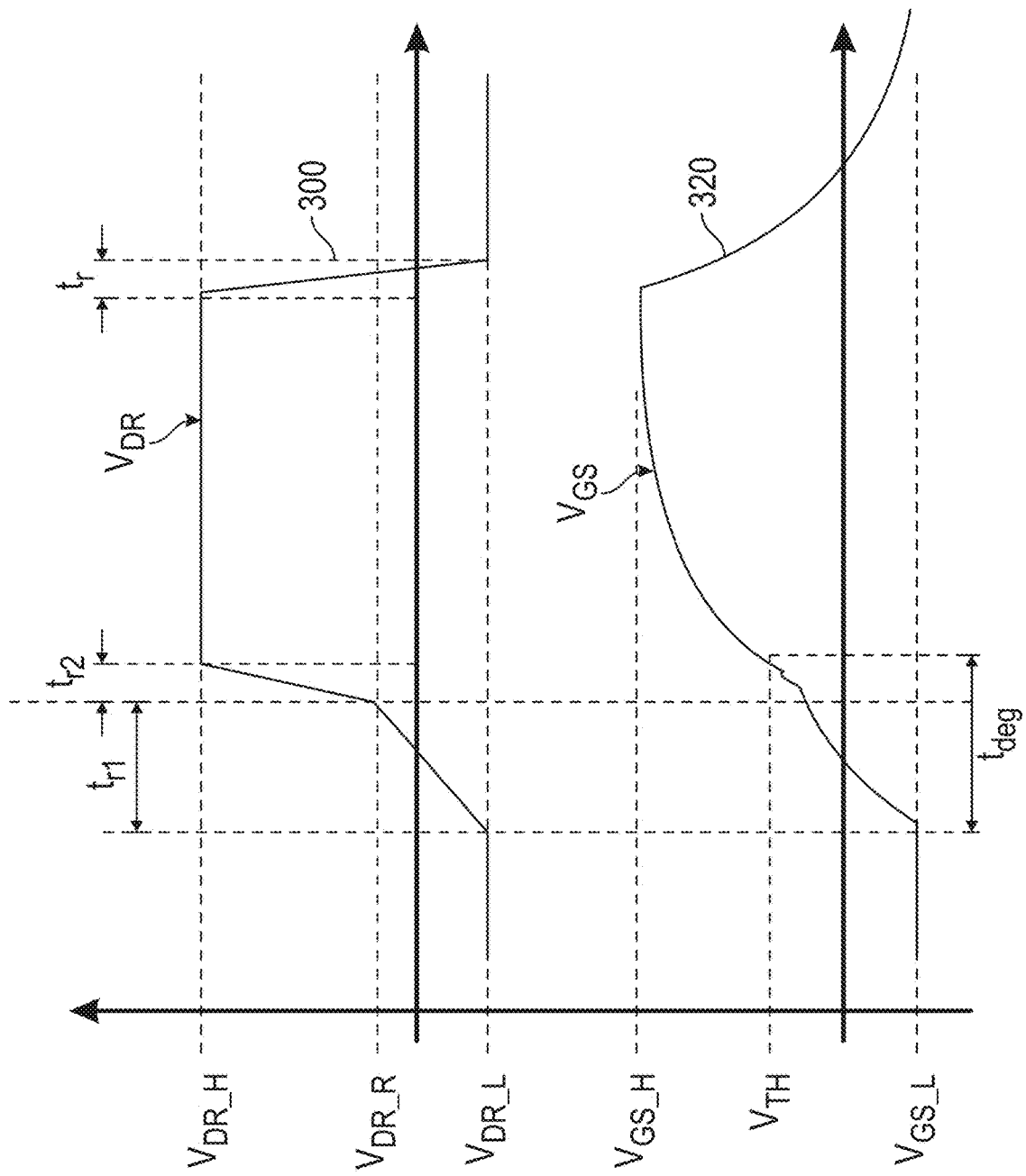
FIGS. 4A, 4B, and 4C illustrate an exemplary driving signal, driver circuit, and voltage pulses for reducing GSI via one or more ramped segments in accordance with another aspect of the disclosure.
Figure 4B:
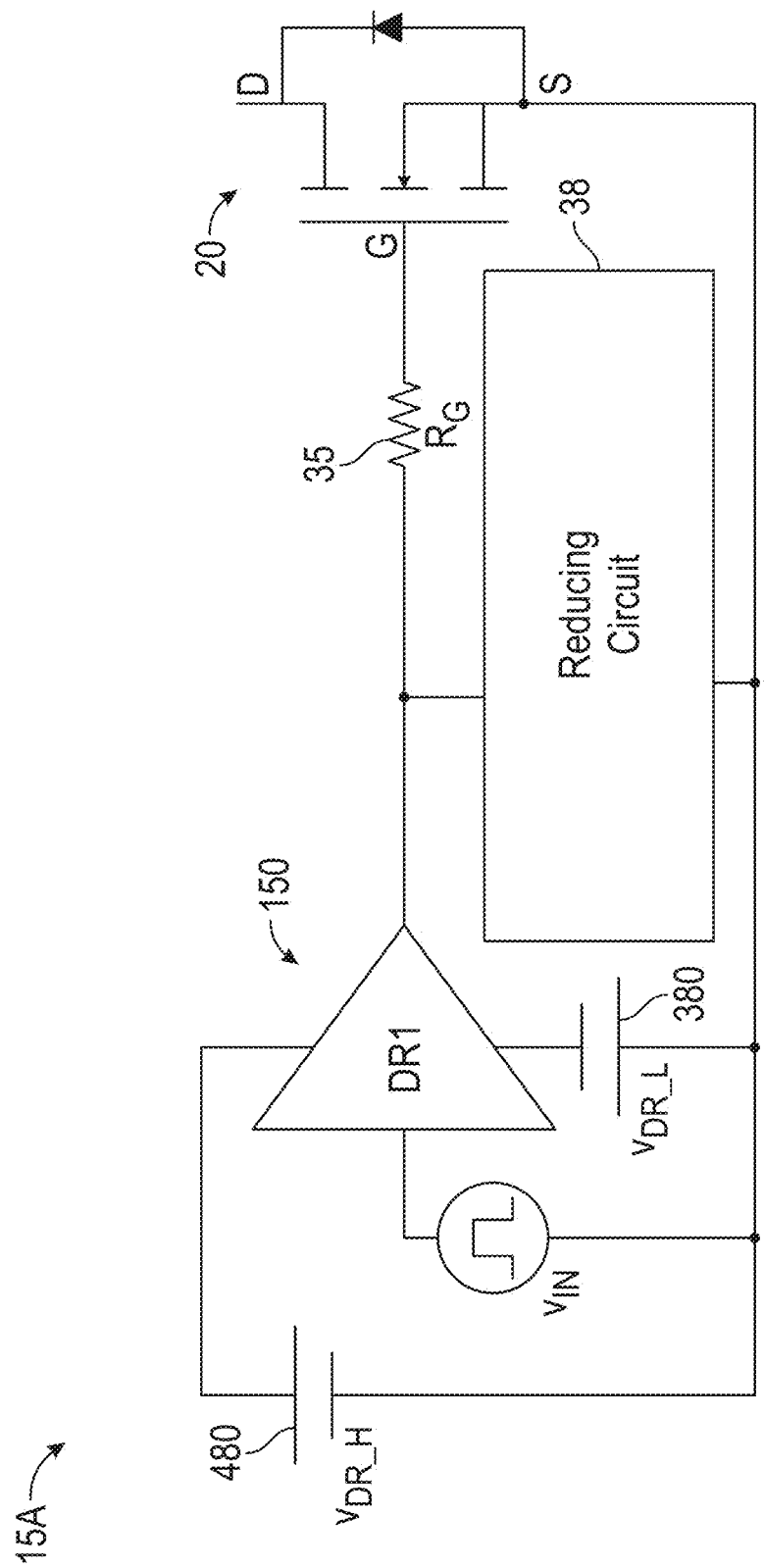

A representative driver circuit 15A suitable for providing the trajectories of FIG. 4A is shown in FIG. 4B. The driver circuit 15A is constructed as the first driver circuit 150 as shown. For the power switch 20 having a gate terminal (G), a source terminal (S), and a drain terminal (D), the first driver circuit 150 is connected to the gate terminal (G) through the gate resistor ($R_G$) 35. Voltage source 480 provides the relatively high voltage ($V_{DR\_H}$) to the first driver circuit 150, with the low voltage ($V_{DR\_L}$) provided via the voltage source 380. In this single-driver implementation, a $$\frac{d_{V_{GS}}}{dt}$$

reducing circuit 38 is included to reduce $$\frac{d_{V_{GS}}}{dt}$$

when $V_{GS} < V_{TH}$.

Figure 4C:
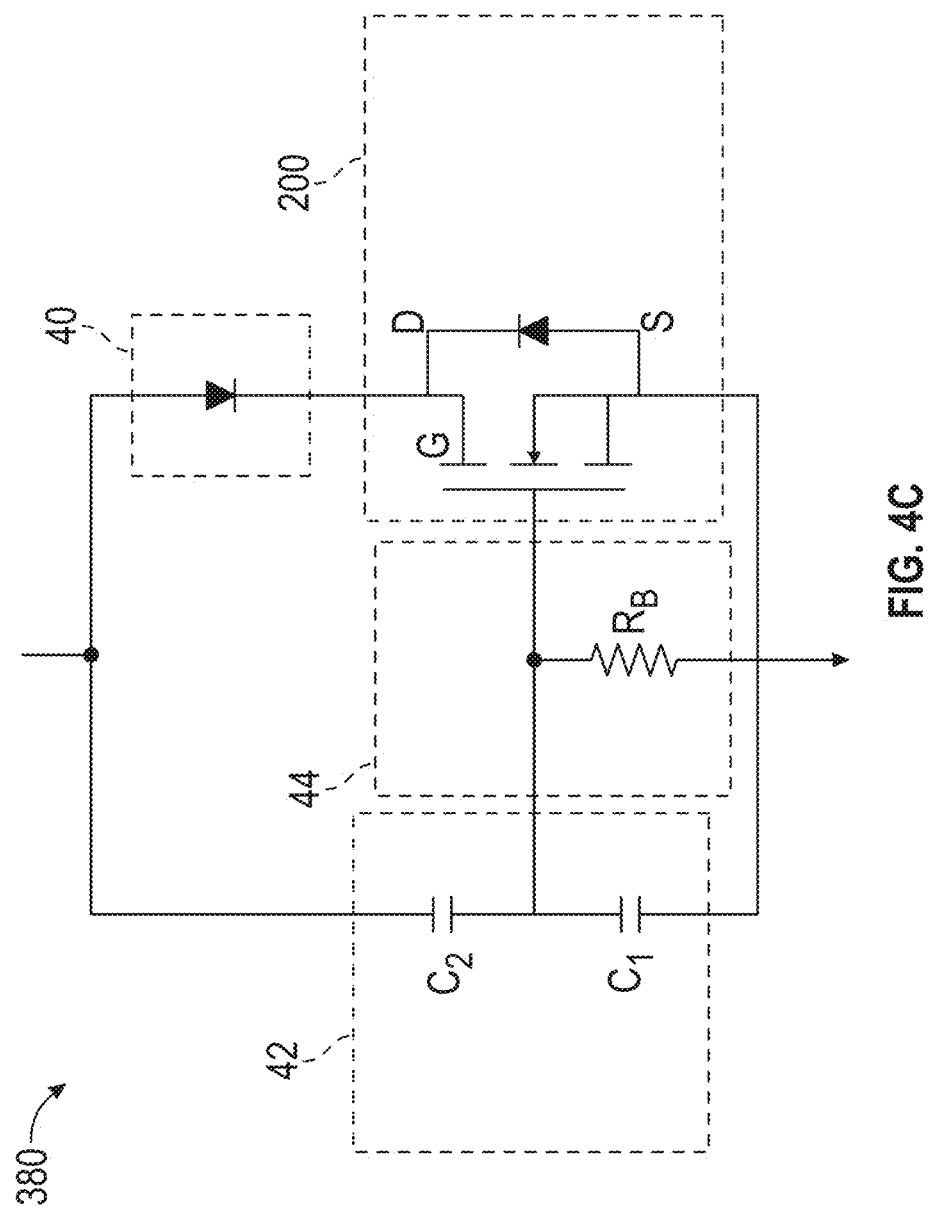

As shown in FIG. 4C, the reducing circuit 38 of FIG. 4B for reducing $d_{V_{GS}}/dt$ may be implemented using various circuit components. For example, the reducing circuit 38 may include a MOSFET 200, e.g., a low-voltage N-type MOSFET, configured to interrupt the Vos ramp rate to the power switch 20 for a short interval, thus generating $t_{relax}$. A low-voltage diode 40 may be used to help avoid current to the first driver circuit 150 of FIG. 4B, with the low-voltage diode 40 acting as a parasitic element when the driver signal is negative. A capacitance divider 42, shown as capacitors $C_1$ and $C_2$, are used to adapt the amplitude of the driver signal to activate the power switch 20. A bleeding resistor ($R_B$) 44 may be connected to the gate (G) as shown to ensure the power switch 20 is only in an ON state for a short time interval. Other implementations of the reducing circuit 38 of FIG. 4B may be contemplated within the scope of the disclosure, and therefore the approach of FIG. 4C is exemplary and non-limiting of the present teachings.

$$\frac{d_{V_{GS}}}{dt}$$

may be implemented as a reducing circuit 380 having various circuit components. For example, the reducing circuit 380 may include a MOSFET 200, e.g., a low-voltage N-type MOSFET, configured to interrupt the $V_{GS}$ ramp rate to the power switch 20 for a short interval, thus generating $t_{relax}$. A low-voltage diode 40 may be used to help avoid current to the first driver circuit 150 of FIG. 4B, with the low-voltage diode 40 acting as a parasitic element when the driver signal is negative. A capacitance divider 42, shown as capacitors $C_1$ and $C_2$, are used to adapt the amplitude of the driver signal to activate the power switch 20. A bleeding resistor ($R_B$) 44 may be connected to the gate (G) as shown to ensure the power switch 20 is only in an ON state for a short time interval. Other implementations of the reducing circuit 38 of FIG. 4B may be contemplated within the scope of the disclosure, and therefore the approach of FIG. 4C is exemplary and non-limiting of the present teachings.

Figure 5A:
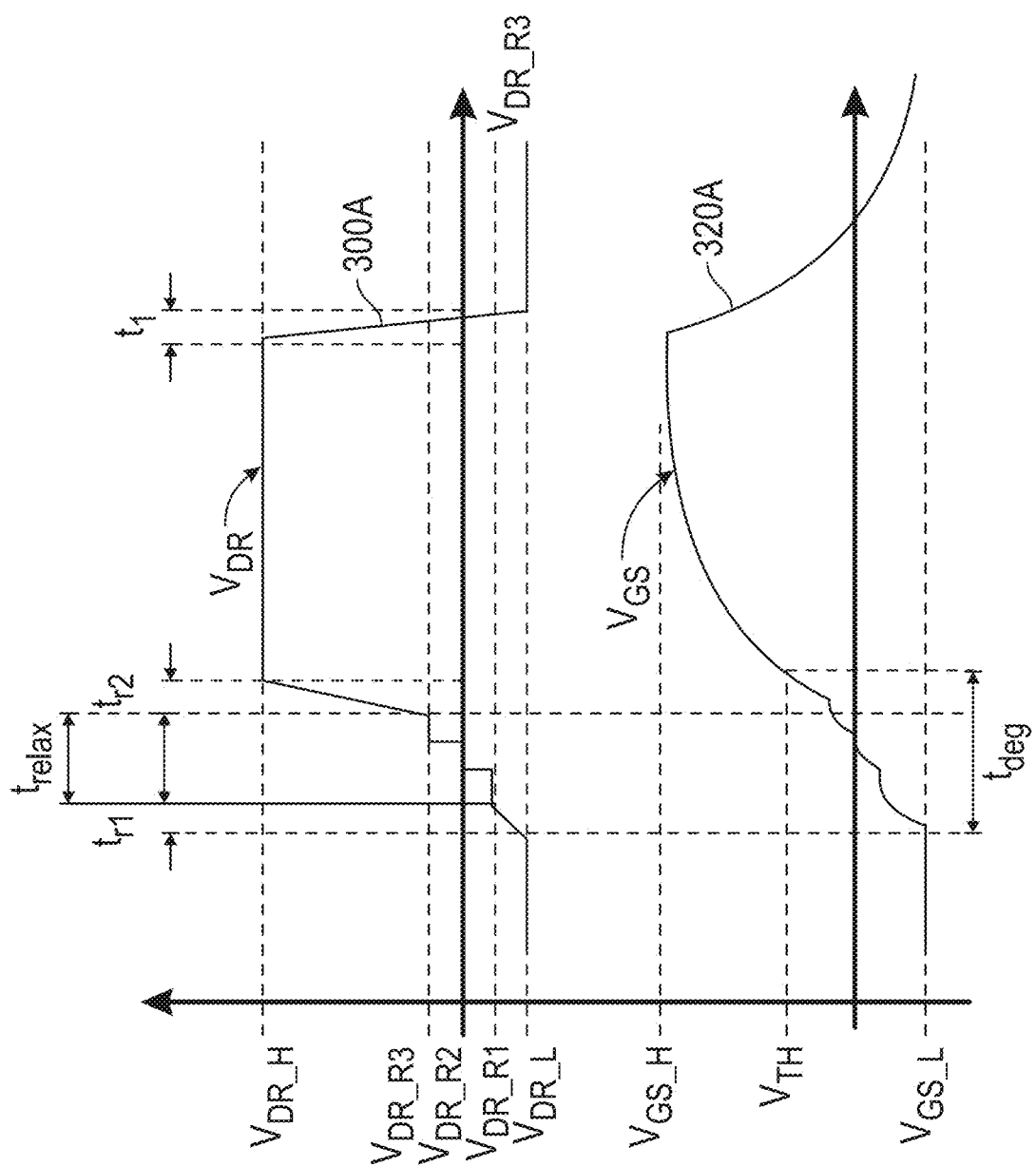
FIGS. 5A, 5B, and 5C illustrate an exemplary driving signal, driver circuit, and voltage pulse for reducing GSI via a succession of stepped segments in accordance with another aspect of the disclosure.

Referring now to FIG. 5A, traces 300A and 320A represent yet another alternative implementation for shaping trajectories of the driving voltage ($V_{DR}$) and the gate-to-source voltage ($V_{GS}$). In this approach, the rise in the driving voltage ($V_{DR}$) occurs over the degradation interval ($t_{deg}$) as a series of steps and ramps. That is, for trace 300A, i.e., the low-to-high voltage transition from $V_{DR\_L}$ to $V_{DR\_H}$, intermediate voltage levels $V_{DR\_Ri}$ may be attained over duration $t_{r1}$, with the interval $t_{relax}$ being used to complete multiple step increases, possibly at different voltage levels and different time intervals, i.e., to levels $V_{DR\_R2}$ and $V_{DR\_R3}$. Trace 300A may then be ramped to the relatively high voltage, $V_{DR\_H}$, over the interval $t_{r2}$, with the driving voltage ($V_{DR}$) thereafter plateauing until the power switch 20 is turned off over falling interval $t_f$. The corresponding effect on trace 320A over the degradation interval ($t_{deg}$) is a series of lobes or curved steps as the gate-to-source voltage ($V_{GS}$) increases from the relatively low voltage ($V_{GS\_L}$) to the threshold voltage ($V_{TH}$).

Any driving voltage levels ($V_{DR\_Ri}$) used to execute the series of steps should fulfill the condition $V_{TH} > V_{DR\_Ri} > V_{DR\_L}$. The sum of the times needed to ramp between such steps and the plateau times for each $V_{DR\_Ri}$ may be defined as follows:

$$t_{relax}: t_{r1} + t_{relax} > t_r$$

Figure 5C:
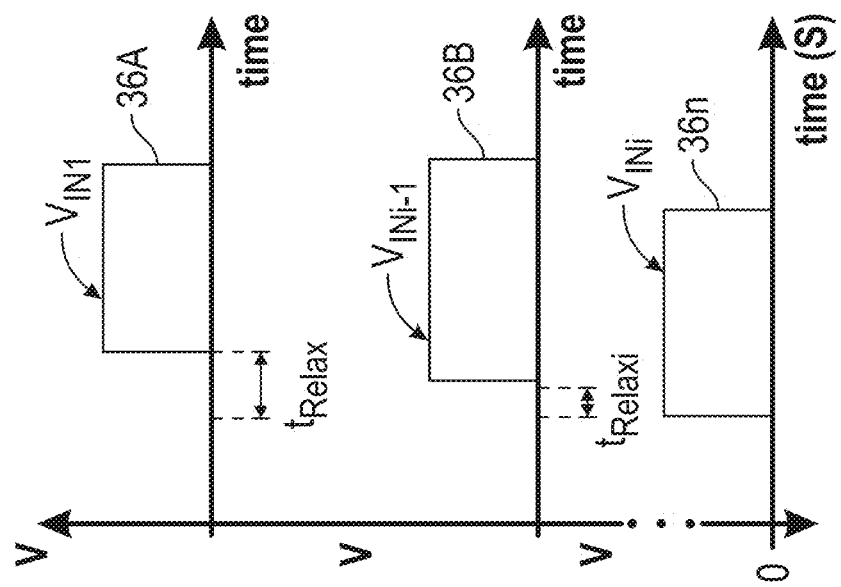
Figure 5B:
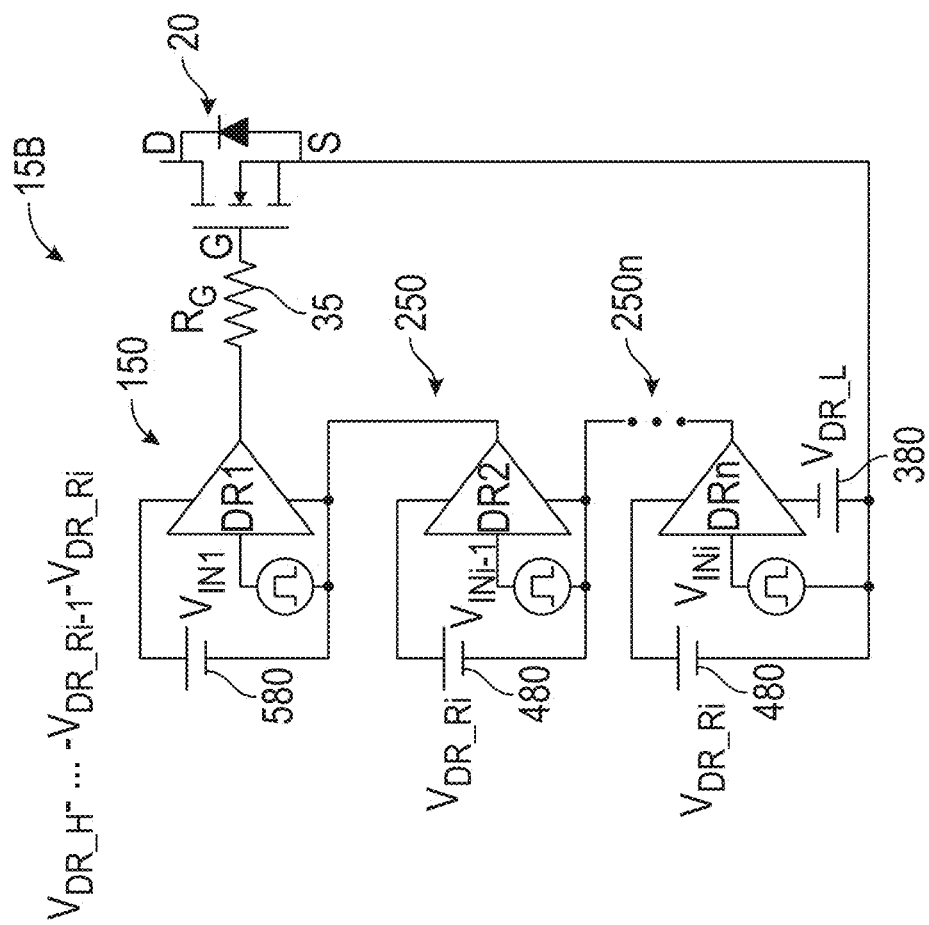

A possible hardware implementation usable for achieving the trajectories of traces 300A and 320A of FIG. 5A is shown in FIG. 5B. Here, the driver circuit 15B may be constructed as multiple driver circuits 150, 250, . . . , 250n, i.e., DR1, DR2, . . . DRn. As explained above, the first driver circuit 150 is connected to the power switch 20 via the gate resistor 35. Individual voltage sources 480 and 580 may be connected to respective driver circuits 150, 250, . . . , 250n as shown, with the voltage sources 480 and 580 having the indicated voltage values, i.e., $V_{DR\_Ri}$ (for voltage sources 480) and $V_{DR\_H}$ . . . -$V_{DR\_Ri-1}$-$V_{DR\_Ri}$. Use of the driver circuit 15B will result in pulses 36A, 36B, and 36n of FIG. 5C, i.e., $V_{IN1}$, $V_{INi-1}$, and $V_{INi}$, for a non-limiting embodiment using three drivers. The pulses 36A, 36B, . . . , 36n initiate at different times to provide the desired trajectories of FIG. 5A, for instance with pulse 36A commencing after $t_{relax}$, and pulse 36B commencing earlier than pulse 36A, i.e., after a duration $t_{relaxi}$ after initiation of pulse 36n.

Figure 6:
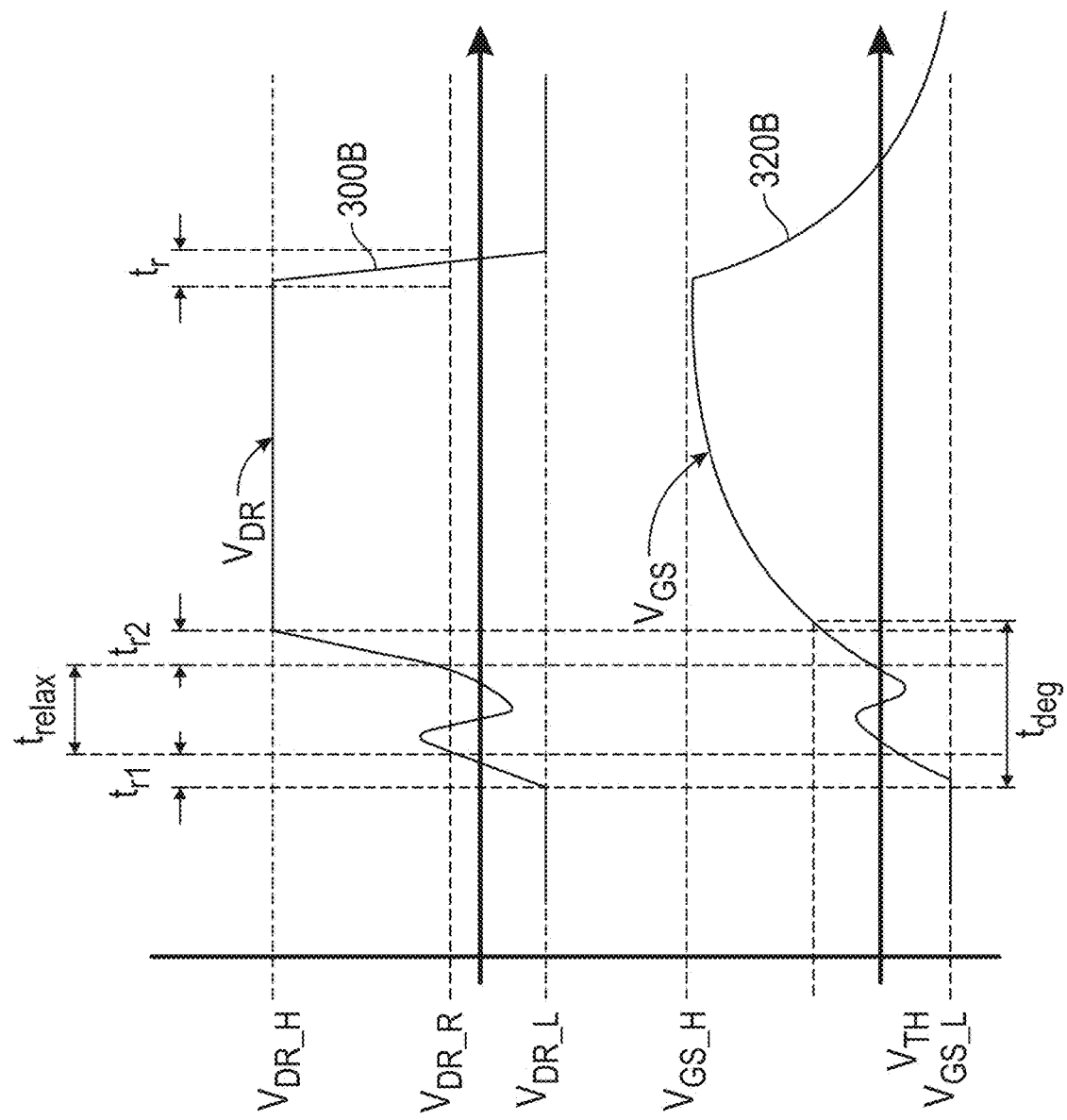
FIG. 6 illustrates an exemplary driving signal and driver circuit for reducing GSI via a periodic oscillatory signal.

Referring now to traces 300B and 320B of FIG. 6, the present teachings may be implemented as a periodic oscillatory signal in lieu of the above-described stepped and/or ramped profiles of FIGS. 3A, 4A, and 5A. That is, rather than using a driving voltage ($V_{DR}$) and gate-to-source voltage ($V_{GS}$) with linear trajectories over the full duration of the degradation interval ($t_{deg}$), it is possible to generate the periodic oscillatory signal with a medium driving voltage, i.e., $V_{DR\_R}$.

By way of an example and not of limitation, and referring briefly again to FIG. 3B, the driver circuit 15B may be used to produce the oscillatory signal of FIG. 6 by adding the resonant tank 46 to its topology. The output of the second driver circuit 250 may be connected to the resonant tank 46 in this embodiment, such that the resonant tank 46 is connected to the second driver circuit 250 and to the source terminal (S) of the power switch 20. Gain control of the resonant tank 46 may be used to generate the oscillatory signal of FIG. 6, as appreciated in the art, by filtering out harmonics and outputting a sine wave.

As appreciated in the art, the resonant tank 46 (also referred to in the art as a resonant circuit or tuned circuit) is an inductor-capacitor (LC) circuit that can determine the oscillation frequency and sustain oscillation via positive feedback. The resonant tank 46 may be constructed, for example, from a capacitor, a resonant inductor, a magnetizing inductor, and a transformer. The resonant inductor in a possible implementation is arranged in series with the resonant capacitor and transformer, while the magnetizing inductor is connected in parallel with the resonant capacitor and transformer. The resonant tank 46 has the ability to resonate at a resonant frequency $$f_{res} = \frac{1}{(2\pi\sqrt{LC})}.$$

At the resonant frequency, the inductive and capacitive reactance are equal in magnitude and opposite in sign, thus canceling each other out. As a result, the impedance of the resonant tank 46 is purely resistive and determined solely by losses in the inductors and capacitor.

Figures 7A, 7B:
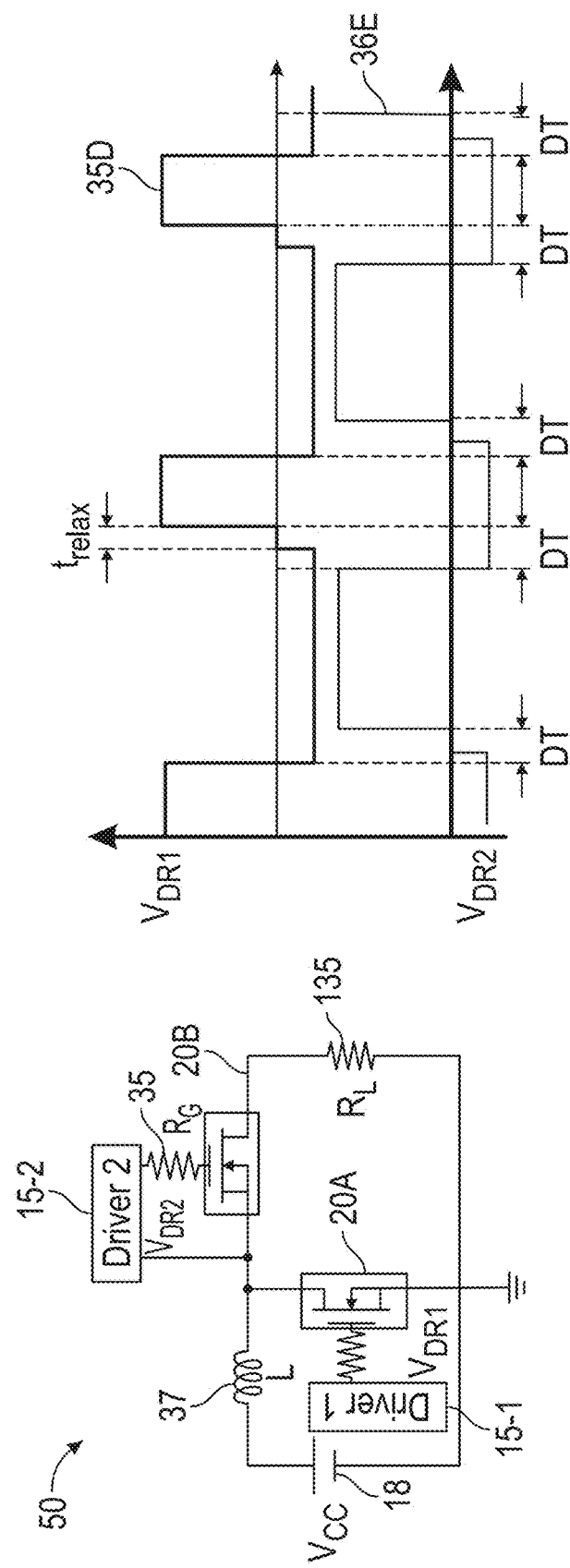
FIGS. 7A and 7B are a respective half-bridge circuit diagram and pulse train in accordance with an aspect of the disclosure.

Referring now to FIG. 7A, a half-bridge 50 may be used to implement a DC-DC converter in lieu of the inverter circuit 11 of FIG. 1, with the half-bridge circuit 50 controlled via any of the present driving signal methodologies described above. A signal may be generated as the driving voltage ($V_{DR1}$, $V_{DR2}$) for each of the power switches 20 used in the half-bridge 50, in this instance the power switches 20A and 20B. Driver circuits 15-1 and 15-2 may be used to provide a driving voltage ($V_{DR1}$, $V_{DR2}$) to the respective power switches 20A and 20B. A load resistance ($R_L$) 135 represents the resistance of a coupled load. Other components of the representative half-bridge 50 include an inductor (L) 37 and the voltage source 18.

The half-bridge 50 of FIG. 7A may therefore be used to generate the pulse trains 35D and 35E of FIG. 7B. Here, $t_{r1}$ and $t_{relax}$ are embedded within the deadtime (DT), i.e., the period during which neither of the power switches 20A and 20B of the half-bridge circuit 50 conducts. As noted above, representative values for tri and $t_{relax}$ are about 10 ns to about 200 ns. By comparison, deadtime (DT) may be on the order of about 300 ns to about 800 ns. Thus, FIG. 7B is not drawn to scale, but rather is exaggerated for clarity.

The solutions set forth above are therefore usable for reducing GSI in SiC power MOSFETs and other voltage-controlled power switches 20. By implementing the various drive methodologies of FIGS. 3A, 4A, 5A, and 6, e.g., in a half-bridge 50 as shown in FIG. 7A, aboard the electric drive system 10 of FIG. 1, or in other electrical systems, one can avoid permanent shifts in threshold voltage ($V_{TH}$) and on-state resistance ($R_{dson}$). This is accomplished by reducing $$\frac{dv_{GS}}{dt}$$

without impacting switching losses. These and other attendant benefits will be appreciated by those skilled in the art having the benefit of the present teachings.

While several modes for carrying out the many aspects of the present teachings have been described in detail, those familiar with the art to which these teachings relate will recognize various alternative aspects for practicing the present teachings that are within the scope of the appended claims. The above description and accompanying drawings are illustrative and exemplary of the entire range of alternative embodiments that an ordinarily skilled artisan would recognize as implied by, structurally and/or functionally equivalent to, or otherwise rendered obvious based upon the included content, and not as limited solely to those explicitly depicted and/or described embodiments.

Moreover, the present concepts expressly include combinations and sub-combinations of the described elements and features. The detailed description and the drawings are supportive and descriptive of the present teachings, with the scope of the present teachings defined solely by the claims. Words of approximation, such as "about," "almost," "substantially," "generally," "approximately," and the like, may each be used herein to denote "at, near, or nearly at," or "within 0-5% of," or "within acceptable manufacturing tolerances," or any logical combination thereof, for example.

What is claimed is:

1. An electrical circuit comprising:
   a power switch having a threshold voltage ($V_{TH}$), a gate-to-source voltage ($V_{GS}$) that is responsive to a driving voltage ($V_{DR}$) to the power switch, and a degradation interval ($t_{deg}$) during which the gate-to-source voltage ($V_{GS}$) increases from a relatively low voltage level ($V_{GS\_L}$) below the threshold voltage ($V_{TH}$) toward a relatively high voltage level ($V_{GS\_H}$) above the threshold voltage ($V_{TH}$); and
   a driver circuit connected to a gate terminal of the power switch, wherein the driver circuit is operable to generate a non-linear trajectory of the driving voltage ($V_{DR}$) over a full duration of the degradation interval ($t_{deg}$), wherein the gate-to-source voltage ($V_{GS}$) is different from the driving voltage ($V_{DR}$).

2. The electrical circuit of claim 1, wherein the driver circuit is constructed as a multi-level driver circuit.

3. The electrical circuit of claim 2, wherein the multi-level driver circuit includes a three or more driver circuits.

4. The electrical circuit of claim 1, wherein the power switch includes a metal-oxide semiconductor field-effect transistor (MOSFET).

5. The electrical circuit of claim 4, wherein the MOSFET is a silicon carbide (SiC) power MOSFET.

6. The electrical circuit of claim 1, wherein the trajectory of the driving voltage ($V_{DR}$) over the full duration of the degradation interval ($t_{deg}$) includes multiple ramped segments.

7. The electrical circuit of claim 6, wherein a pair of the multiple ramped segments are connected by a plateau segment.

8. The electrical circuit of claim 1, wherein the trajectory of the driving voltage over the full duration of the degradation interval ($t_{deg}$) includes multiple stepped segments.

9. The electrical circuit of claim 1, wherein the driver circuit includes a reducing circuit configured to reduce a rate of change $$\left(\frac{dv_{GS}}{dt}\right)$$

of the gate-to-source voltage ($V_{GS}$) during the degradation interval ($t_{deg}$).

10. The electrical circuit of claim 9, wherein the reducing circuit includes an N-type metal-oxide semiconductor field-effect transistor (MOSFET), a bleeding resistor ($R_B$) coupled to a gate terminal of the N-type MOSFET, a diode connected to a drain terminal of the N-type MOSFET, and a capacitance divider that is connected to the bleeding resistor and the N-type MOSFET.

11. The electrical circuit of claim 1, wherein the driver circuit includes a resonant tank, and is operable to shape the trajectory of the driving voltage via the resonant tank such that the driving voltage ($V_{DR}$) has a periodic oscillating trajectory over the full duration of the degradation interval ($t_{deg}$).

12. An electric drive system, comprising:
 a direct current (DC) power supply;
 a DC link capacitor connected in parallel with the DC power supply;
 an inverter circuit connected to the DC link capacitor and having:
  a plurality of silicon carbide (SiC) power metal-oxide semiconductor field-effect transistors (MOSFETs), each respective one of the SiC power MOSFETs having a threshold voltage ($V_{TH}$), a gate-to-source voltage ($V_{GS}$) that is responsive to a driving voltage ($V_{DR}$), and a degradation interval ($t_{deg}$) during which the gate-to-source voltage ($V_{GS}$) increases from a relatively low voltage level ($V_{GS\_L}$) below the threshold voltage ($V_{TH}$) toward a relatively high voltage level ($V_{GS\_L}$) above the threshold voltage ($V_{TH}$); and
  a plurality of driver circuits, each driver circuit of the plurality of driver circuits being connected to a respective gate terminal of a different one of the SiC power MOSFETs, wherein the driver circuits are collectively operable to generate a non-linear trajectory of the driving voltage ($V_{DR}$) over a full duration of the degradation interval ($t_{deg}$), wherein the gate-to-source voltage ($V_{GS}$) is different from the driving voltage ($V_{DR}$);
 a polyphase electric machine connected to the inverter circuit;
 a rotary output member coupled to the polyphase electric machine; and
 a load coupled to the rotary output member.

13. The electric drive system of claim 12, wherein the plurality of driver circuits are coupled to the respective gate terminal via a gate resistor.

14. The electric drive system of claim 12, wherein the trajectory of the driving voltage ($V_{DR}$) over the full duration of the degradation interval ($t_{deg}$) includes multiple ramped segments.

15. The electric drive system of claim 12, wherein the trajectory of the driving voltage ($V_{DR}$) over the full duration of the degradation interval ($t_{deg}$) includes multiple stepped segments.

16. The electric drive system of claim 12, wherein the plurality of driver circuits include a reducing circuit configured to reduce a rate of change $$\left(\frac{dv_{GS}}{dt}\right)$$

of the gate-to-source voltage ($V_{GS}$) during the degradation interval ($t_{deg}$).

17. The electric drive system of claim 12, wherein at least one of the driver circuits includes a resonant tank that operable to generate the trajectory of the driving voltage ($V_{DR}$) as a periodic oscillating trajectory over the full duration of the degradation interval ($t_{deg}$).

18. An electrical circuit for use with a silicon carbide (SiC) power metal-oxide semiconductor field-effect transistor (MOSFET), comprising:
 a gate resistor; and
 a plurality of driver circuits coupled to a gate terminal of the SiC power MOSFET via the gate resistor, wherein the driver circuits are collectively operable to generate a driving voltage ($V_{DR}$) to the SiC power MOSFET over a degradation interval ($t_{deg}$) during which a gate-to-source voltage ($V_{GS}$) increases from a relatively low voltage level ($V_{GS\_L}$) below a threshold voltage ($V_{TH}$) of the SiC power MOSFET toward a relatively high voltage level ($V_{GS\_H}$) above the threshold voltage ($V_{TH}$) of the SiC power MOSFET, such that a trajectory of the driving voltage ($V_{DR}$) is non-linear across over a full duration of the degradation interval ($t_{deg}$) and includes multiple ramped segments or multiple stepped segments, wherein the gate-to-source voltage ($V_{GS}$) is responsive to and different from the driving voltage ($V_{DR}$).

19. The electrical circuit of claim 18, wherein the electrical circuit includes a reducing circuit configured to reduce a rate of change ($^{dv}_{GS}$/dt) of the gate-to-source dt voltage ($V_{GS}$) during the degradation interval ($t_{deg}$), and wherein the reducing circuit includes an N-type MOSFET, a bleeding resistor ($R_B$) coupled to a gate terminal of the N-type MOSFET, a diode connected to a drain terminal of the N-type MOSFET, and a capacitance divider that is connected to the bleeding resistor and the N-type MOSFET.

20. The electrical circuit of claim 18, further comprising:
 a resonant tank, wherein the plurality of driver circuits is operable to output the driving voltage ($V_{DR}$) with a periodic oscillating trajectory over the full duration of the degradation interval ($t_{deg}$) via the resonant tank.

* * * * *